United States Patent [19]
Wilson et al.

[11] Patent Number: 5,625,358
[45] Date of Patent: Apr. 29, 1997

[54] DIGITAL PHASE-LOCKED LOOP UTILIZING A HIGH ORDER SIGMA-DELTA MODULATOR

[75] Inventors: James Wilson, Foxboro; Ronald A. Cellini, Newton, both of Mass.

[73] Assignee: Analog Devices, Inc., Norwood, Mass.

[21] Appl. No.: 403,291

[22] Filed: Mar. 14, 1995

Related U.S. Application Data

[63] Continuation-in-part of Ser. No. 121,104, Sep. 13, 1993, and a continuation-in-part of Ser. No. 120,957, Sep. 13, 1993, and a continuation-in-part of Ser. No. 241,059, May 11, 1994, Pat. No. 5,497,152, and a continuation-in-part of Ser. No. 343,713, Nov. 22, 1994, and a continuation-in-part of Ser. No. 373,864, Jan. 17, 1995, Pat. No. 5,489,903, and a continuation-in-part of Ser. No. 328,560, Oct. 25, 1994, Pat. No. 5,485,152, and a continuation-in-part of PCT/US94/10268, Sep. 13, 1994 and PCT/US94/1029, Sep. 13, 1994.

[51] Int. Cl.$^6$ .................................................. H03M 3/02
[52] U.S. Cl. ................................................................ 341/143
[58] Field of Search ........................... 341/143, 61, 123, 341/144

[56] References Cited

U.S. PATENT DOCUMENTS

| | | | |
|---|---|---|---|
| 4,179,670 | 12/1979 | Kingsbury | 331/10 |
| 4,281,318 | 7/1981 | Candy et al. | 341/61 |
| 4,797,845 | 1/1989 | Stikvoort | 364/724.1 |
| 4,953,117 | 8/1990 | Lagadec | 364/724.1 |
| 4,954,824 | 9/1990 | Yamada et al. | 341/61 |
| 4,987,373 | 1/1991 | Soo | 328/155 |
| 4,990,911 | 2/1991 | Fujita et al. | 341/123 |
| 5,075,679 | 12/1991 | Gazsi | 341/143 |
| 5,111,151 | 5/1992 | Ii | 328/155 |
| 5,111,417 | 5/1992 | Belloc et al. | 364/724.1 |
| 5,119,093 | 6/1992 | Vogt et al. | 341/123 |
| 5,121,065 | 6/1992 | Wagner | 324/607 |
| 5,157,395 | 10/1992 | Del Signore et al. | 341/143 |
| 5,204,827 | 4/1993 | Fujita et al. | 364/724.1 |
| 5,227,787 | 7/1993 | Kurashina | 341/61 |
| 5,313,205 | 5/1994 | Wilson | 341/144 |
| 5,353,026 | 10/1994 | Wilson | 341/143 |

FOREIGN PATENT DOCUMENTS

0227172 7/1987 European Pat. Off. ........ H03H 17/06

OTHER PUBLICATIONS

J. Janssen, et al. A New Principle/IC for Audio Sampling Rate Conversion, presented at the 96th Convention, Feb. 26, 1994–Mar. 1, 1994.

Richard J. Higgins, Digital Signal Processing in VLSI, Prentice Hall, Englewood Cliffs, NJ 07632, 1990, pp. 29–31.

Douglas F. Elliott, et al, Fast Transforms, Algorithms, Analyses, Applications, 1982, Academic Press, p. 13.

(List continued on next page.)

*Primary Examiner*—Brian K. Young
*Attorney, Agent, or Firm*—Wolf, Greenfield & Sacks, P.C.

[57] ABSTRACT

A method and apparatus for phase locking to an input signal and outputting a sigma-delta modulated control signal. The method and apparatus of the present invention provide a sigma-delta modulated control signal which can be utilized by any one of a decimator for decimating a digital data at a first data rate to a digital data at a second data rate and an interpolator for interpolating a digital data at a first data rate to a digital data at a second data rate. The decimator and the interpolator can be utilized in any one of an analog-to-digital converter, a digital-to-analog converter and a digital-to-digital converter. In one embodiment, a period of the input signal is determined and fed to a phase-locked loop which includes a sigma-delta modulator for providing the sigma-delta modulated control signal. The phase-locked loop also includes a phase detector for determining a phase and a frequency-difference between the input signal and a conversion signal generated by the phase-locked loop. The method and apparatus thus locks to the phase and the frequency of the input signal and provide a phase-locked sigma-delta-modulated control signal.

15 Claims, 9 Drawing Sheets

OTHER PUBLICATIONS

Paul J. Hurst, et al. A Programmable Clock Generator Using Noise Shaping and Its Application in a Switched–Capacitor Filter, Solid State Circuits Research Laboratory, Dept. of Electrical and Computer Engineering, University of California, Davis (two pages), no date of reference available.

Electronique, No. 24, Jan. 1993, Paris, France, pp. 42–44, Trazeguet, H., "Les CAN Delta–Sigma Deviennent Progammables".

Patent Abstracts of Japan, vol. 003, No. 018 (E–091) Feb. 16, 1979 & JP–A–53147409 (Fujitsu Ltd.) Dec. 22, 1978.

International Search Report From International Patent Application, PCT/US94/10269 Filed Sep. 13, 1994.

DIGITAL PHASE-LOCKED LOOP UTILIZING A HIGH ORDER SIGMA-DELTA MODULATOR

BACKGROUND OF THE INVENTION

Related Applications

This is a continuation-in-part under 35 U.S.C. §120 of application Ser. No. 08/121,104, filed on Sep. 13, 1993 entitled "ANALOG TO DIGITAL CONVERSION USING NON-UNIFORM SAMPLE RATES"; of application Ser. No. 08/120,957, filed on Sep. 13, 1993 entitled "DIGITAL TO ANALOG CONVERSION USING NON-UNIFORM SAMPLE RATES"; of application Ser. No. 08/241,059 filed on May 11, 1994 now U.S. Pat. No. 5,497,152 entitled "DIGITAL-TO-DIGITAL CONVERSION USING NON-UNIFORM SAMPLE RATES"; of application Ser. No. 08/343,713 filed on Nov. 22, 1994 entitled "VARIABLE SAMPLE RATE ADC"; of application Ser. No. 08/373,864 filed on Jan. 17, 1995 now U.S. Pat. No. 5,489,903 entitled "DIGITAL TO ANALOG CONVERSION USING NON-UNIFORM SAMPLE RATES"; and of application Ser. No. 08/328,560 filed on Oct. 25, 1994 now U.S. Pat. No. 5,485,152 entitled "ANALOG TO DIGITAL CONVERSION USING NON-UNIFORM SAMPLE RATES." The disclosure of each of the above applications is hereby incorporated by reference in its entirety. In addition, this is a continuation-in-part under 35 U.S.C. §120 of PCT/US94/10268, filed on Sep. 13, 1994 entitled "ANALOG TO DIGITAL CONVERSION USING NON-UNIFORM SAMPLE RATES" and PCT/US94/10269, filed on Sep. 13, 1994 entitled "DIGITAL TO ANALOG CONVERSION USING NON-UNIFORM SAMPLE RATES." The disclosure of each of the above international applications is herein incorporated by reference.

1. Field of the Invention

The present invention relates generally to the field of digital phase-locked loop circuits. More particularly, the present invention relates to a digital phase locked loop utilizing a high-order sigma-delta modulator which can be used in conjunction with an analog-to-digital converter, a digital-to-analog converter, and a digital-to-digital converter.

2. Discussion of the Related Art

FIG. 1 illustrates a phase-locked loop circuit which has been used in conjunction with, for example, an analog-to-digital converter or a digital-to-analog converter to lock to an external clock signal. The phase-locked loop circuit of FIG. 1 has been used in an AD28msp01 Echo-Cancelling Modem Analog Front End circuit, made by Analog Devices, Inc., One Technology Way Norwood, Mass. U.S.A. 02062-9106. The AD28msp01 is a complete analog front end for high performance DSP-based modems. The device includes all data conversion, filtering and clock generation circuitry needed to implement an echo-cancelling modem with one companion digital signal processor. Further information on the AD28msp01 can be obtained from Analog Devices, Inc. An advantage of the circuit of FIG. 1 is that, for example, an analog-to-digital converter or a digital-to-analog converter, used in conjunction with the phase-locked loop of FIG. 1, can be synchronized to an external clock signal and need not be limited to an on-chip master clock signal.

In the phase-locked loop circuit 10 of FIG. 1, an external clock signal is applied on line 12 to a phase detector 14 which produces a signal 18 proportional to a phase difference between the external clock signal on line 12 and a conversion signal (TCONV) on line 16. The conversion signal will be described in more detail hereinafter. The output signal of the phase detector, on line 18, is filtered by a loop filter 20. Typically, the loop filter has a high gain, preferably infinite, so that the phase-locked loop can always lock to the external clock signal 12 with no phase error. In addition, the loop filter acts a low-pass filter.

An output of the loop filter, on line 22, is fed to a first-order, two-bit sigma-delta modulator 24. The sigma-delta modulator 24 produces, on line 26, a two-bit digital word which is used to control a variable divider 28. As will be further explained hereinafter, the sigma-delta modulator 24 modulates the signal on line 22, which is representative of the frequency of the external clock signal on line 12. An example will serve to illustrate this function.

Assume that the data rate of the synchronization signal on line 12 is 7.2 kHz. Further assume that a frequency of a master clock signal, on line 30, fed to the variable divider 28 is 13.824 MHz. If the desired data rate of the signal on line 16 is 7.2 kHz, a signal on line 32, fed to a fixed divider 34 having a fixed dividing ratio (M) of, for example, 240, must be at a data rate of 1.728 MHz. Therefore, the two-bit code output on line 26 by the sigma-delta modulator 24 must instruct the variable divider 28 to divide the master clock signal by a factor of 8 in order to get the 1.728 MHz signal desired.

One of the limitations of this phase-locked loop circuit is that the phase-locked loop 10 is limited to a fixed operating range around a center frequency of the external clock signal, in order to keep the signal 32 at approximately 1.728 MHz. The 1.728 MHz is required by the analog-to-digital converter or the digital-to-analog converter of the AD28msp01 analog front end chip to clock a 1-bit analog-to-digital converter for converting an analog signal to a 1-bit digital signal at an oversampled rate or to clock a 1-bit digital-to-analog converter for converting an oversampled digital signal to an analog signal. The fixed range of operation of the phase-locked loop 10 is thus a function of the dividing ratio M of the variable divider and the center frequency of the external clock signal 12. In addition, another limitation of the phase-locked loop circuit 10 is that the variable divider must be instructed what frequency the external clock signal 12 is at, in order to choose the variable dividing ratio M. Thus, the phase-locked loop circuit 10 has a limited range over which it can lock to an external clock signal, and it must be instructed as to the frequency of the external clock signal.

In addition, another limitation of the phase-locked loop circuit 10 is that a non-linear mapping results between the two-bit code, output, on line 26, by the sigma-delta modulator and the resulting conversion frequency signal TCONV. In other words, if the frequency of the conversion signal TCONV is plotted as a function of the two bit code, on line 26, as shown in FIG. 2, a non-linear relationship results. A linear relationship is ideally desired, so that the conversion signal TCONV can be changed in linear steps and so that the steps are fixed across the dynamic operating range of the phase-locked loop 10. Thus, a disadvantage of the phase-locked loop circuit 10 is that the conversion frequency signal cannot be linearly incremented by stepping through the various steps of the 2-bit code 26.

Still another limitation of the this phase-locked loop circuit 10 is that, due to the infinite gain of the loop filter 20, the circuit is characterized by undesirable phase noise. The phase noise results from the gain of the loop itself; the higher the gain, the higher the phase noise. Thus, an inherent trade off exists in responsiveness of the phase-locked loop to the external clock signal, which is a function of the loop gain, and the phase noise of the phase-locked loop. The infinite gain of the loop filter 20, of the phase-locked loop circuit 10, results in ideal responsiveness of the phase-locked loop 10 to the external clock signal, but also produces unwanted amplified phase noise.

Therefore, an object of the present invention is to provide an improved digital phase-locked loop which provides one or more of the advantages recited herein.

SUMMARY OF THE INVENTION

In one embodiment of the invention, a counter receives an input signal and a master clock signal and determines a period of the input signal, and outputs a period signal indicating a number of master clock pulses within the period of the input signal. A phase-locked loop receives the period signal and the input signal and provides a phase difference signal which represents a phase- and a frequency-difference between the period signal and the input signal. A sigma-delta modulator, within the phase-locked loop, receives a signal which is a sum of the phase-difference signal and the period signal and provides a sigma-delta modulated control signal which is phase- and frequency-locked to the phase and the frequency of the input signal. The phase-locked loop circuit allows the phase-locked loop to lock to any input signal within a locking range of the circuit and to supply a sigma-delta modulated control signal.

The sigma-delta modulated control signal can be used in conjunction with any one or more of an analog-to-digital converter, a digital-to-analog converter and a digital-to-digital converter. In particular, the sigma-delta modulated control signal can be used to variably interpolate digital data at a first data rate to digital data at a second data rate. Still further, the sigma-delta modulated control signal can be used to variably decimate digital data at a first data rate to digital data at a second data rate. The variable interpolator can be disposed after an analog-to-digital converter, for example, to variably increase a data rate of a digital signal output by the analog-to-digital converter. The variable decimator can be disposed, for example, before a digital-to-analog converter to variably decimate a data rate of a digital signal before outputting it to the digital-to-analog converter.

In another embodiment of the invention, a sigma-delta modulator provides a sigma-delta modulated control signal representative of a data rate of an input signal to the sigma-delta modulator and further includes a means for inverting the input signal and for scaling the input signal by a fixed scaling factor, such that no truncation errors, resulting from an inversion of the input signal, exist. This embodiment of the sigma-delta modulator can be used within The phase-locked loop circuit to provide the sigma-delta modulated control signal.

In still another embodiment of the invention, a first sigma-delta modulator provides a first sigma-delta modulated control signal representative of a data rate of an input signal to the first sigma-delta modulator. In addition, a second sigma-delta modulator coupled to an output of the first sigma-delta modulator, scales the first sigma-delta modulated control signal and provides a second sigma-delta modulated control signal which is locked to the first sigma-delta modulated control signal.

Either one of the first and second sigma-delta modulated control signals can be fed to an interpolator circuit to variably interpolate a digital data at a first data rate to a digital data at a second data rate. In addition, either one of the first and second sigma-delta modulated control signals can be fed to a decimator circuit to variably decimate a digital data at a first data rate to a digital data at a second data rate. Still further, either one of the first and second sigma-delta modulated control signals can be fed to a suppressor circuit to suppress pulses of a master clock signal, on average, to produce a digital clock signal.

In still another embodiment of the invention, a sigma-delta modulator provides a sigma-delta modulated control signal representative of a data rate of an input signal to the sigma-delta modulator. A magnitude of the sigma-delta modulated control signal can be varied to effect a phase change of a control system in which the sigma-delta modulator is utilized. This control system can be used, with an interpolator, to interpolate digital data at a first data rate to digital data at a second data rate and also to line up a phase of the control system to a phase of the digital data at the first data rate. In addition, the control system can be used with a decimator to decimate digital data at a first data rate to digital data at a second data rate and to line up a phase of the control system to a phase of the digital data at the first data rate.

The features and advantages of the present invention will be more readily understood and apparent from the following detailed description of the invention, which should be read in conjunction with the accompanying drawings, and from the claims which are appended at the end of the detailed description.

BRIEF DESCRIPTION OF THE DRAWING

The foregoing and other objects and advantages of the invention will become more clear with reference to the following detailed description of the drawings, in which like elements have been given like reference characters, and in which.

In the drawing.

DETAILED DESCRIPTION

For purposes of illustration only, exemplary embodiments of the present invention will now be explained with reference to specific data rates, division ratios, and the like. One skilled in the art will recognize that the present invention is not limited to the specific embodiments disclosed, and can be more generally applied to other circuits and methods having different operating parameters than those illustrated.

Figure 3:
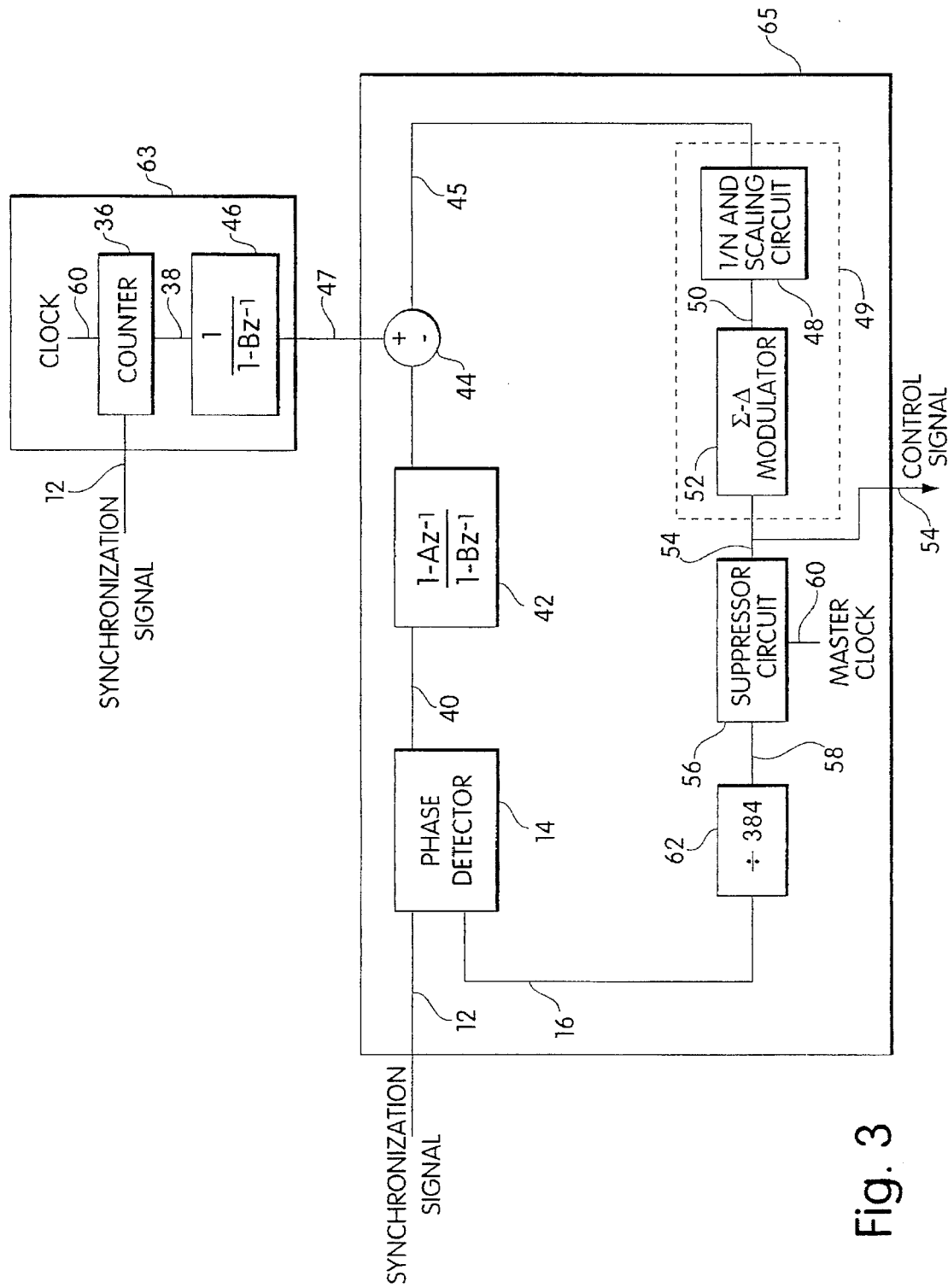
FIG. 3 is a block diagram of a phase-locked loop circuit according to the present invention.

FIG. 3 is a block diagram of one embodiment of a phase-locked loop 100 according to the present invention. The overall purpose of the phase-locked loop circuit 100 is to lock to an external clock signal such as an off-chip clock signal, on line 12, and to generate a sigma-delta modulated control signal, on line 54, to be utilized by one or more of analog-to-digital converter, a digital-to-analog converter, or a digital-to-digital converter, such as described in the aforementioned applications. In circuit 100, the external clock signal, on line 12, is fed to a frequency counter 36 which produces a signal, on line 38, representative of the period of the external clock signal 12. In addition, the external clock signal is applied to a phase detector 14 which produces a phase-detected signal on line 40, proportional to a phase- and a frequency-difference between the external clock signal, on line 12, and a conversion signal on line 16.

In a preferred embodiment of the phase-locked loop circuit 100, the phase detector 14 is a phase- and frequency-detector, which provides both phase and frequency information at its output line 40. Phase and frequency converter circuits are well known in the art. One example of such a circuit may be found in *Phased locked loops, Theory Design and Applications* by Dr. Roland E. Best, published by McGraw-Hill Company ©1984.

The phase-detected signal, on line signal 40, is filtered by a low-pass filter 42 and is summed, in summer 44, with the signal on line 38, representative of the frequency of the external clock signal 12. In a preferred embodiment of the phase-locked loop 100, a filter 46, which is also a low-pass filter, is disposed between the counter 36 and the summer 44. A filtered signal, on line 47, is sent to the summer 44.

A summed signal, on line 45, is fed to a 1/N and scaling circuit 48, which determines an inverse of a period of the summed signal, on line 45, and also performs a fixed scaling of the inverted summed signal. A scaled signal, on line 50, output from the 1/N and scaling circuit 48, is fed to an n-bit sigma-delta modulator 52. The 1/N and scaling circuit 48 and the n-bit sigma-delta modulator 52 combine to form a 1/N and scaling sigma-delta modulator 49. Additional details of the 1/N and scaling sigma-delta modulator 49 will be described hereinafter.

In a preferred embodiment of this circuit 100, the sigma-delta modulator 52 is a 4-bit, third-order sigma-delta modulator. However, it should also be appreciated that the invention is not so limited. For example, the sigma-delta modulator 52 may also be a one-bit modulator if a clock frequency used to drive the sigma-delta modulator is appropriately increased. Further, an sigma-delta modulator having a larger number of bits could also be used if the clock frequency is appropriately decreased. Still further, a higher- or lower-order sigma-delta modulator could also be used. Of course, it is well known that the higher the order of the sigma-delta modulator, the better the noise-shaped characteristics of the signal output by the sigma-delta modulator.

Figure 1:
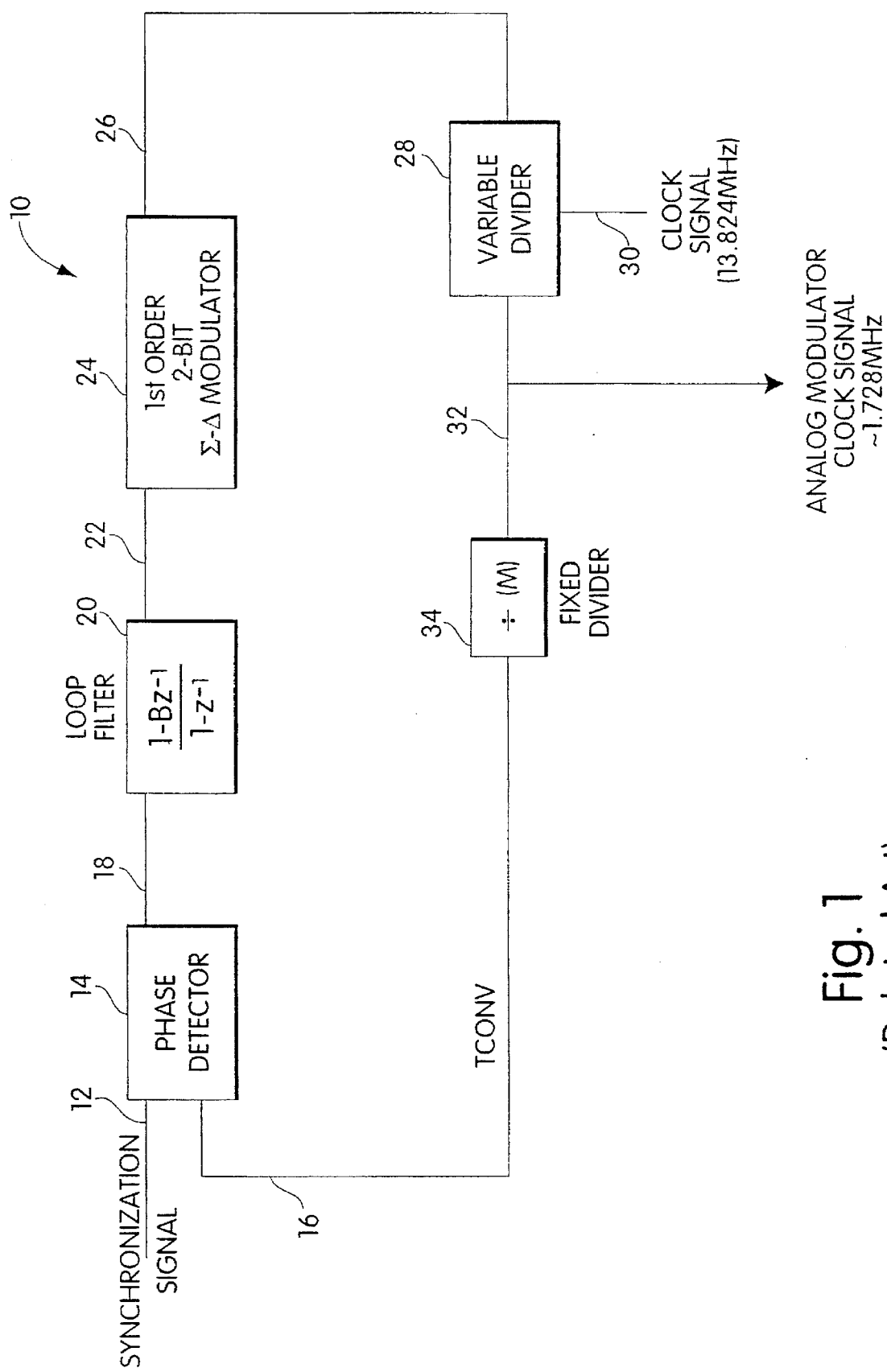
FIG. 1 is a block diagram of a phase-locked loop circuit which has been used in an echo-cancelling modem and analog front-end circuit.
Figure 2:
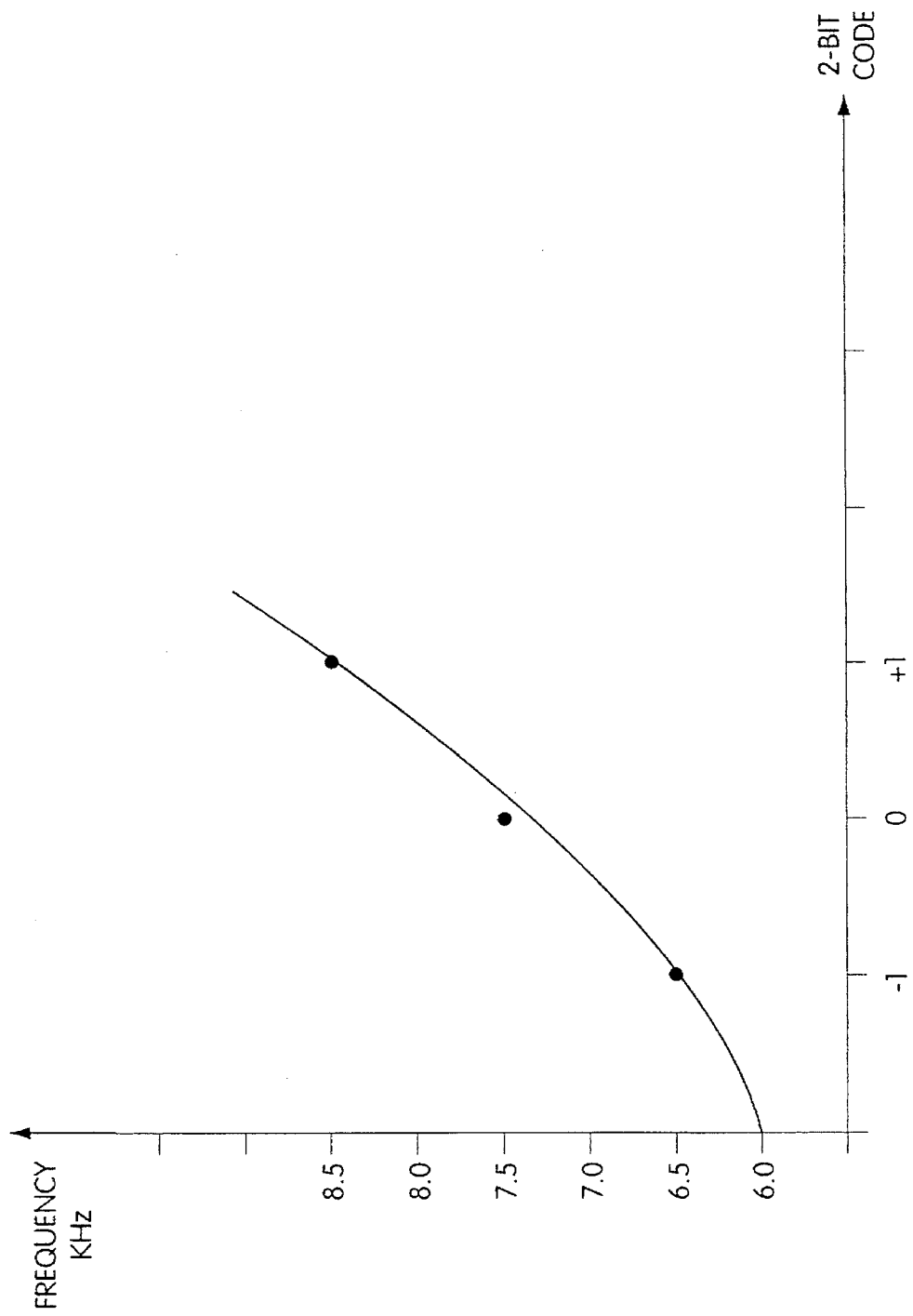
FIG. 2 is a graphical illustration of a frequency of a conversion signal generated by the phase-locked loop of FIG. 1 as a function of the two-bit code output by a sigma-delta modulator within the phase-locked loop of FIG. 1.

A 4-bit code, on line 54, output by the 1/N and scaling sigma-delta modulator 49, may be utilized, for example, by an analog-to-digital converter, as disclosed in FIG. 2 of the application Ser. No. 08/124,104, to increase the sample rate of a digital data stream on line 17, output by an analog-to-digital converter 11. The 4-bit code may also be used by a digital to-analog converter, for example as disclosed in FIG. 2 of U.S. application Ser. No. 08/120,957, to decimate a digital data stream on line 19, under the control of the 1/N and scaling sigma-delta modulator 49. The 4-bit code may also be used by a digital-to-digital converter, such as is disclosed in FIG. 2 of U.S. application Ser. No. 08/241,059, to increase a data rate of a digital data stream, on line 28, and/or to decimate a data rate of a digital data stream, on line 19, under control of the 1/N and scaling sigma-delta modulator 49.

The 4-bit code may also be fed to a clock suppressor circuit 56, as disclosed in FIG. 3. An output clock signal, on line 58, will be at 384 times the frequency of the external clock signal on line 12. The suppressor circuit 56, acts to suppress a number X of master clock signals, on line 60, in response to the 4-bit code output by the 1/N and scaling sigma-delta modulator 49. A first X number of master clock pulses, on line 60, are suppressed in response to the 4-bit code, on line 54. The following examples will serve to illustrate the operation of this circuit 100.

Assume that the master clock signal, on line 60, fed to the counter 36 and the suppressor circuin 56, is a 24.576 MHz clock signal comprising eight clock pulses per period of the clock signal. Each clock pulse, of the eight clock pulses, thus is at a frequency of 3.072 MHz. Further assume that the external clock signal, on line 12, is at a data rate of 48 kHz and that the scaling function of the 1/N and scaling circuit 48 is fixed at 3072. For every one period of the 48 kHz external clock signal, there are 512 master clock pulses applied to counter 36. Thus, counter 36 will produce a period signal, on line 38, representative of 512 master clock pulses. The 1/N and scaling modulator 49 in turn yields the 4-bit code of +2 which reflects an allowance value of 3072/512=6. The allowance value corresponds to allowing 6 out of the 8 master clock pulses through the suppressor circuit 56. In other words, a first 2 of the 8 master clock pulses 60, are suppressed, and the last 6 master clock pulses are allowed to pass. The +2 code thus represents the 4-bit code which is the value for a 48 kHz external clock signal on line 12.

Table 1 illustrates the relationship among the 4-bit codes that are produced by the 1/N and scaling sigma-delta modulator 49, the allowance value by which the master clock signal, on line 60, is suppressed by circuit 56 and the external clock signal (conversion signal 16) frequency.

TABLE 1

| 4 BIT CODE | ALLOWANCE VALUE | CORRESPONDING TO EXTERNAL SIGNAL FREQUENCY OF (KHz) |
| --- | --- | --- |
| +4 | 8 | 64 |
| +3 | 7 | 56 |
| +2 | 6 | 48 |
| +1 | 5 | 40 |
| 0 | 4 | 32 |
| −1 | 3 | 24 |
| −2 | 2 | 16 |
| −3 | 1 | 8 |
| −4 | 0 | DC |

In accordance with Table 1, the suppressor circuit 56 allows a number of master clock signals, on line 60, to pass through the suppressor circuit 56 as a function of the 4-bit code, on line 54, output by the 1/N and scaling sigma-delta modulator 52. For example, for the external clock signal of 48 kHz the sigma-delta modulator 40 outputs, on average, a +2 4-bit code value which corresponds to an allowance value of six, as described above. The +2 code directs the suppressor circuit 56 to allow six out of every eight master clock signals 60 to pass through the circuit 56. Stated another way, circuit 56 suppresses two out of every eight 24.576 MHz clock signals 60 in response to the +2 code 54.

The 4-bit code, on line 54, output by the 1/N and scaling sigma-delta modulator 49 is a resulting average of all codes produced by the sigma-delta modulator 52 upon sigma-delta modulation of the scaled and inverted signal, on line 50, output by the 1/N and scaling circuit 48. Thus, a +2 code is not produced every time the 1/N and scaling sigma-delta modulator 49 outputs a 4-bit code, on line 54. Other 4-bit codes will also be produced, but with a lower frequency of occurrence. As is well known in the field of sigma-delta systems, noise produced by a sigma-delta modulator can be removed by digital filtering techniques. This is because the sigma-delta modulator shifts the noise to a high frequency domain which can be filtered out by a digital low-pass filter to remove the out of band sigma-delta noise.

One skilled in the art will also appreciate that any external clock frequency in a stable operating range of the sigma-delta modulator, may be produced by varying a ratio of 4-bit codes produced by the 1/N and scaling sigma-delta modulator 49. The stable operating range of the sigma-delta modulator is a range, less than the range of DC to 64 kHz of Table 1, over which the sigma-delta modulator will operate without breaking into oscillations. In a preferred embodiment of the phase-locked loop 100, the sigma-delta modulator has a stable operating range from 4 kHz to 53.8 kHz.

If, for example, external clock signal, on line 12, is at a frequency of 4 kHz, then the counter 36 outputs 6,144 master clock pulses, on line 60, for every one period of external clock signal. The 1/N and scaling circuit 48 then yields an effective input to the sigma-delta modulator 3072/6144 of =0.5. Thus, the sigma-delta modulator 52 outputs, on average, an equal member of −3 and −4 codes. The −3 codes direct the randomizer and suppressor circuit 62 to allow one out of every eight master clock signals, on line 60, to pass through (i.e., circuit 60 suppresses 7 out of 8 24.6576 MHz clock signals). The −4 code directs circuit 62 to allow 0 out of every 8 master clock signals to pass through (i.e., circuit 60 suppresses 8 out of 8 24.576 MHz clocks). Thus, on average, one out of every sixteen 24.576 MHz clocks will pass through the randomizer and suppresser circuit 56 in response to an average of the −3 and −4 codes output by the 1/N and scaling sigma-delta modulator circuit 49. One skilled in the art will thus appreciate that any conversion signal rate within the stable working range of the phase-locked loop circuit can be produced through the appropriate combination of 4-bit codes on line 54.

One additional feature that may be included in the suppressor circuit 56, is a randomizer circuit which eliminates unwanted tones in the conversion signal, on line 48. For example, if the same master clock signals, on line 60, are always suppressed by the circuit 56, for each 4-bit code output from the 1/N and scaling sigma-delta modulator 49, then unwanted tones may appear in the signal on line 58. However, a randomizer circuit will randomly suppress clock cycles of the master clock on line 60, also thereby suppressing these unwanted tones. The randomizer insures that an equal number of pulses in each of the 8 master clock positions are equally suppressed, on average. This may be accomplished, for example, by providing a latch, for each master clock pulse position, that is set whenever the pulse in that position is suppressed. Pulses in that position are not suppressed again until latches corresponding to all 8 master clock pulse positions have been set, after which the latches are all cleared and the sequence of suppression is again repeated. Clock randomizer/suppressor circuits are well known in the art. One example of a clock randomizer/suppressor circuit can be found in *Phased Locked Loops, Theory, Design, and Applications* by Dr. Roland E. Best, published by McGraw-Hill Book Company, ©1984.

The signal, on line 58, output by the clock randomizer/suppressor circuit 56, is then sent to a fixed divider 62 having a fixed dividing ratio of 384, to divide the signal, on line 58, down to the frequency of the external clock signal on line 12. The 1/N and scaling sigma-delta modulator 49 and the suppressor circuit 56, together form a digital-controlled oscillator.

In a preferred embodiment of the phase-locked loop circuit 100, the filter 42 is also provided with a user-programmable gain, embodied by a bit of an addressable register, which can be switched between a gain of (B=2047/2048 finite or 1 infinite). A result of the user-programmable gain is a loop filter gain which is switchable between a finite value and infinity. Thus, the phase-locked loop circuit of FIG. 100 is comprised of two sub-circuits, a first sub-circuit 63 which provides a signal on line 38 indicative of a period of the external clock signal on line 12 and a second sub-circuit 65 which adjusts a phase of the control signal, on line 54, to match the phase of the external clock signal.

An advantage of this phase-locked loop circuit 100 is that a user can switch between a finite gain mode and an infinite gain mode. In the finite gain mode, the circuit is designed to be approximately critically damped. In the infinite gain mode, the circuit is underdamped. In the finite gain mode, a number of cycles of the external clock signal, on line 12, are required in order to lock to a phase of the external clock signal. If, however, the phase-locked loop circuit 100 cannot lock to the external signal, the user can switch the bit of the addressable register to provide an infinite gain response, so that the phase-locked loop circuit can lock more quickly to the external clock signal. Thus, the circuit 100 normally is approximately critically damped. In addition, because the gain of the circuit 100 is normally employs the finite gain mode of the phase-locked loop circuit, the circuit does not suffer from added phase noise characteristics which result from the infinite gain mode.

Another advantage of this embodiment of the phase-locked loop 100 is that there is a linear mapping relationship between the 4-bit code on line 54, output by the 1/N and scaling sigma-delta modulator 49, and the conversion signal on line 16. As shown in Table 1, there is an 8 kHz step between each pair of adjacent 4-bit code values. Thus, as discussed above in the examples given, the phase-flocked loop circuit can be locked to an external clock signal, on line 12, in linear increments of the signal.

The phase-locked loop 100, when used with the analog-to-digital converter, of U.S. application Ser. No. 08/124,104, allows the analog-to-digital converter to lock to the external clock source on line 12 and to operate at a frequency, which may but need not be, the same or even an integer multiple of the master clock signal. Similarly, the phase-locked loop 100, when used with the digital-to-analog converter of U.S. application Ser. No. 08/120,957, allows the digital-to-analog converter to accept digital data at any data rate of the working system, to lock to the external clock signal and to operate the digital-to-analog converter at a frequency which may, but need not, be the same or even an integer multiple of the master clock frequency. Further, the phase-locked loop of the present invention when used with the digital-to-digital converter of U.S. application Ser. No. 08/241,059, allows the digital-to-digital converter to accept digital data at any data rate within the working range of the system, to lock to externally supplied clock source and to convert the incoming digital data to a data rate which may be, but is not necessarily, the same or even an integer multiple of the master clock signal.

Figure 4A:
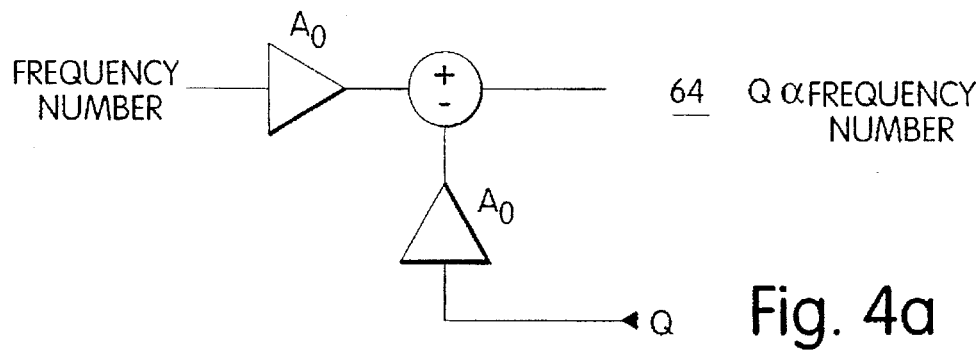
FIGS. 4a–4d illustrate various first stages which can be alternatively selected and used as a first stage of a sigma-delta modulator.
Figure 4B:
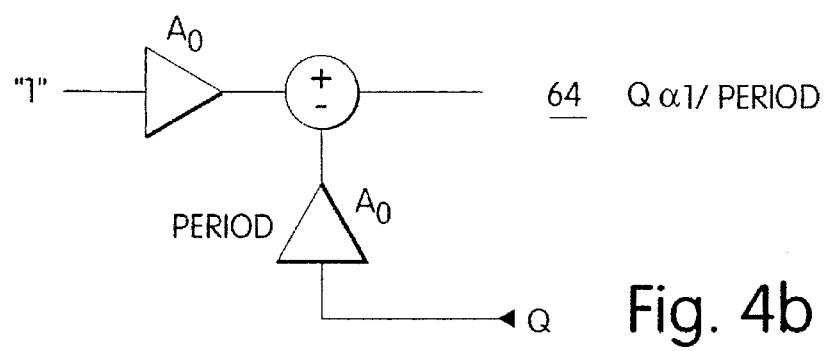
Figure 4C:
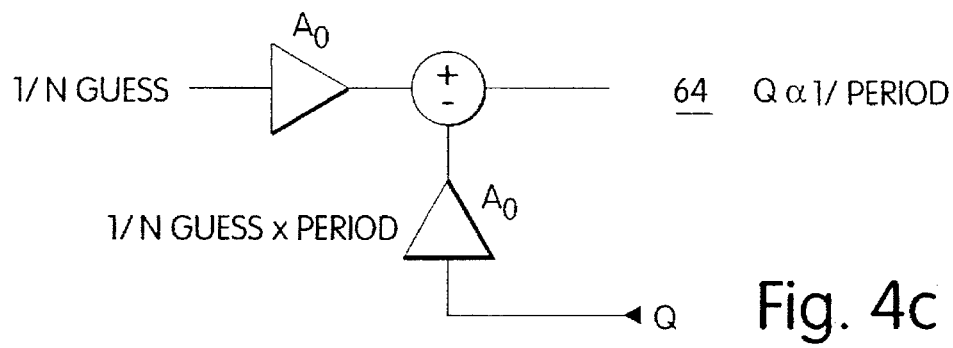
Figure 4D:
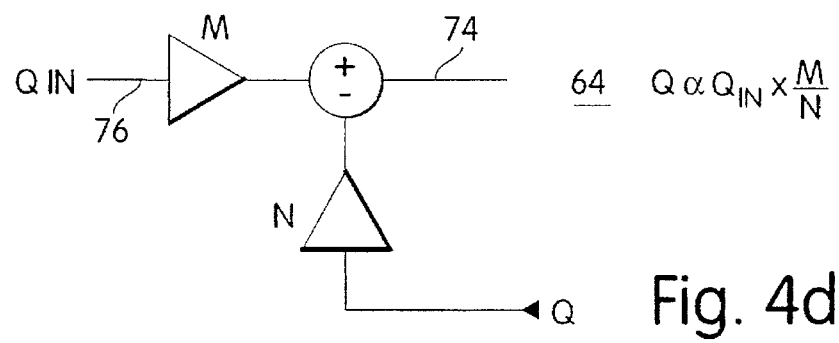

FIGS. 4a)–4d) illustrate a plurality of interchangeable alternatives for a first stage 64 of a sigma-delta modulator, for achieving different types of sigma-delta modulators. For example, there is shown in FIG. 4a) a normal first stage of a sigma-delta modulator, with a first stage coefficient $A_0$ as the input. In FIG. 4b), there is shown a first stage of a 1/N sigma-delta modulator, to be discussed infra. In FIG. 4c), there is shown an alternate embodiment of the 1/N sigma-delta modulator, which will also be discussed infra. FIG. 4d) illustrates a first stage of an M/N scaling sigma-delta modulator, no be discussed infra.

Figure 5:
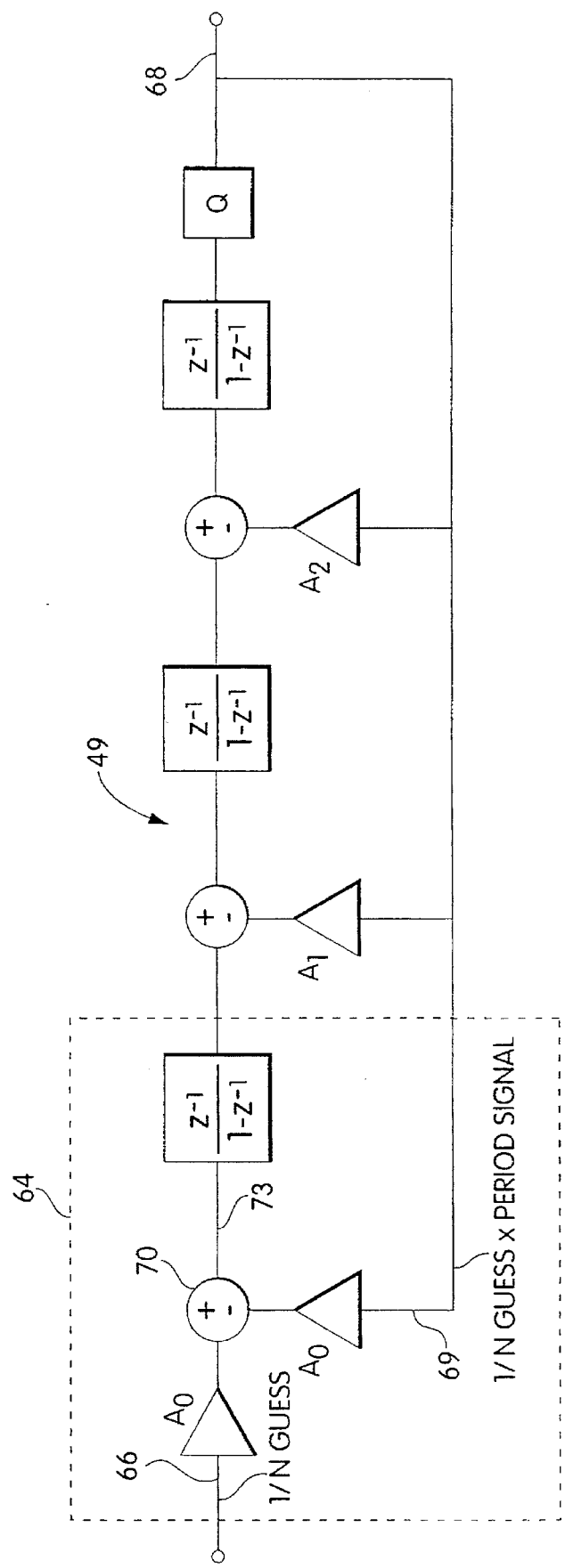
FIG. 5 is a block diagram of a 1/N and scaling sigma-delta modulator according to the present invention.

FIG. 5 is a block diagram of a 4-bit, third-order 1/N sigma-delta modulator 49 which can be utilized in the phase-locked loop 100 of the present invention. It is also to be appreciated that the 1/N sigma-delta modulator is not so limited. For example, any number of bits may be used if an appropriate clock frequency is utilized. Further, any order sigma-delta modulator may be used depending on the desired noise shaping characteristics. An advantage of the 1/N sigma-delta modulator 49 is that no truncation errors result from dividing the signal, on line 45 of the phase-locked loop 100, by N.

A problem with simply computing an inverse of the signal, a truncation error will result since the result cannot be represented practically at the output of the circuit 48. A repercussion of the truncation error in the phase-locked loop circuit 100 is that the phase-locked loop will always be trying to make up for the truncation error and will never be able to exactly phase lock to the external clock signal on line 12. An advantage of the circuit of FIG. 4 is that by incorporating the 1/N function into the sigma-delta modulator, on average, there is no truncation error.

Still another advantage of the 1/N and scaling sigma-delta modulator 49 is that a first stage 64, as illustrated in FIGS. 4b–4c and FIG. 5, prevents any distortion of the modulator's noise shaping characteristics.

Referring to FIG. 5, and more particularly to the first stage 64 of the sigma-delta modulator 49, an n-bit guess, on line 66, of 1/N is input to the first stage. In addition, a product of the periodic signal, on line 68, and the n-bit guess of 1/N, is fed to the first stage of the sigma-delta modulator on line 69. The product of the n-bit guess and the periodic signal is accomplished in a multiplier. The multiplier may be incorporated into the sigma-delta modulator 49 or it may be separate. Each of the terms, on lines 66 and 69, is multiplied by the first coefficient $A_0$ of the sigma-delta modulator. The operation of the first stage 64 of the 1/N and scaling sigma-delta modulator will now be described.

If the n-bit guess, on line 66, of 1/N is close to the product of the n-bit guess of 1/N and the periodic signal on line 69, output by the sigma-delta modulator, then the difference signal, on line 73, output by the summer 70, will be zero. The first stage of the sigma-delta modulator can thus be kept close to the nominal value of the first-stage coefficient $A_0$, by choosing the n-bit guess, on line 66, appropriately. Thus the circuit of FIG. 5 allows the 1/N sigma-delta modulator 49 to operate in the optimum noise shaping range without producing any of the truncation errors.

In a preferred embodiment of the 1/N sigma-delta modulator 49, to be utilized in the phase-locked loop 100 of FIG. 3, the scaling factor 72, equal to a constant of 3072, is accomplished by scaling the input signal, on line 66, by the scaling factor before feeding the input signal to the 1/N modulator 49. However, it is to be appreciated that the scaling factor 72 can be any constant value. Further, it is to be appreciated that the 1/N sigma-delta modulator 49 may be utilized in any circuit that uses a sigma-delta modulator.

Also, in the preferred embodiment of the 1/N sigma-delta modulator 49, utilized in the phase-locked loop circuit 100, the n-bit guess is a 5-bit guess that is implemented as a look-up table. However, it is to be appreciated that any number of bits may be used and that a tradeoff exists between the number of bits used, and the accuracy of the n-bit guess. In addition, the larger the number of bits used, the larger The size of the multiplier that is required to multiply the periodic signal and the n-bit guess. The less the number of bits, the lower is the resolution and accuracy of the n-bit guess. The 5-bit guess results in an overall accuracy of +/–20%.

In addition, in the preferred embodiment of the 1/N sigma-delta modulator 49, a capability to switch between a normal first stage of the sigma-delta modulator, as illustrated in FIG. 4a, and the 1/N first stage 64, as illustrated in FIGS. 4b–4c, exists. This is accomplished by toggling a bit of a programmable control register. Thus, only one sigma-delta modulator, with two selectively interchangeable first stages is needed to be able to perform each of the above sigma-delta modulation functions, and space is thereby saved.

Referring now to FIG. 4d a block diagram of the first stage of an M/N sigma-delta modulator, which can be utilized, for example, instead of the first stage 64 of the sigma-delta modulator of FIG. 5, to provide a third order M/N sigma-delta modulator. The M/N scaling sigma-delta modulator can produce an output signal, on line 74, which is a ratio M/N of the input signal on line 76. The scaling sigma-delta modulator may be used, for instance, to provide an output clock signal, on line 74, which is not necessarily an integer multiple of the input clock signal, on line 76, and which is locked to the input signal.

In a preferred embodiment of the M/N scaling sigma-delta modulator, the coefficients M/N are provided in a look-up table. In addition, in the preferred embodiment, the coefficients M and N are chosen to provide scaling factors which keep the M/N scaling sigma delta modulator operating in the optimum noise shaping range.

Figure 6:
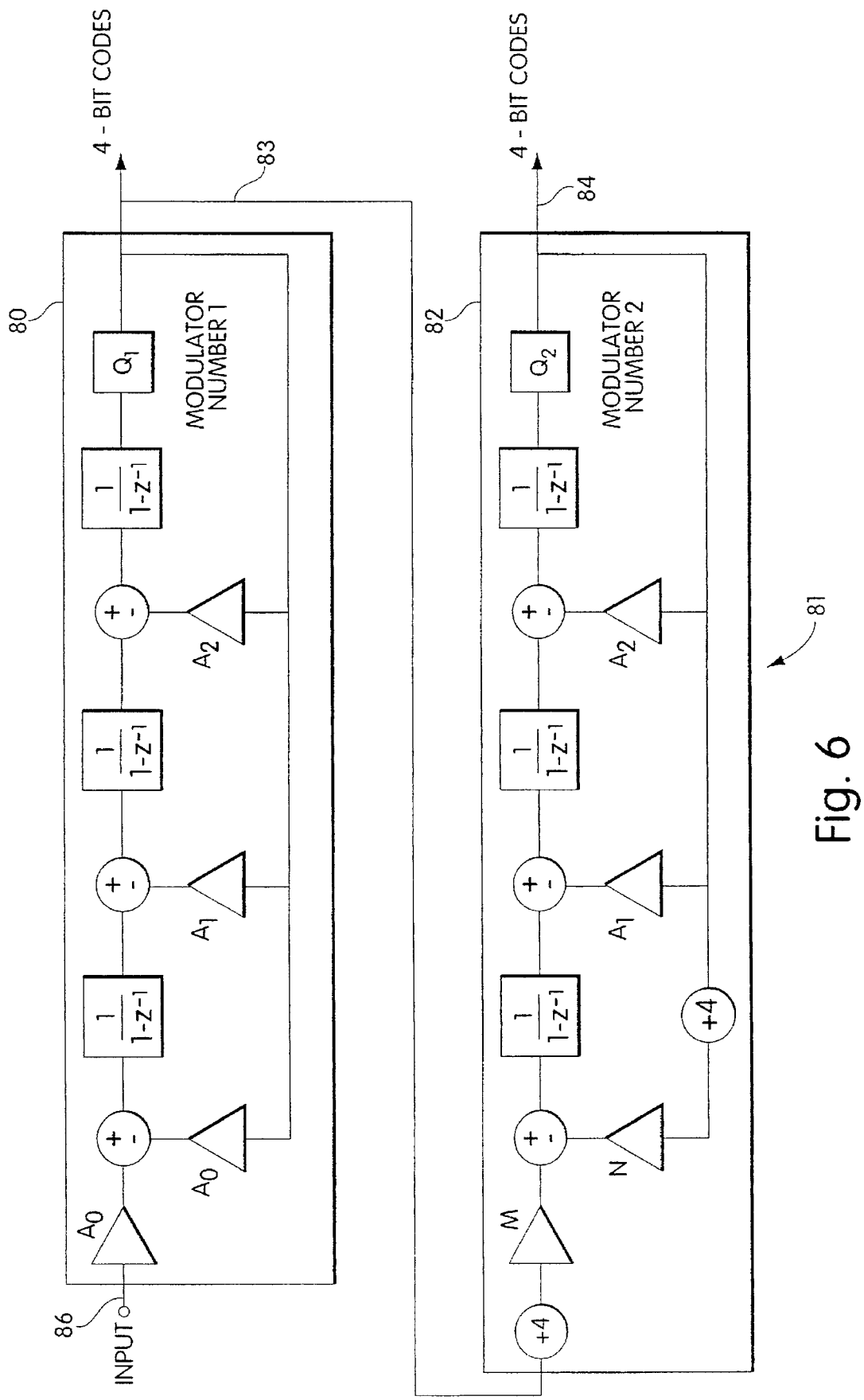
FIG. 6 is a block diagram of a linked sigma-delta modulator according to the present invention.

FIG. 6 is a block diagram of a linked sigma-delta modulator 81. The linked sigma-delta modulator includes a first 80 and a second 82 sigma-delta modulator cascaded in series. With the linked sigma-delta modulator 81, a signal, on line 84, output by the second sigma-delta modulator is linked to a signal, on line 83, output by the first sigma-delta modulator 80.

In a preferred embodiment of the linked sigma-delta modulator 81, the first sigma-delta modulator 80 is a third-order sigma-delta modulator having a normal first stage, as shown in FIG. 4a, and the second sigma-delta modulator 82 is a third-order sigma-delta modulator having an M/N first stage, as disclosed in FIG. 4d. An advantage of the linked sigma-delta modulator of FIG. 6 is that a clock signal, on line 84, can be generated that is not necessarily an integer multiple of the input clock signal, on line 86, to the first sigma-delta modulator 80, and which is also phase-locked to the input clock signal. Thus, with the linked sigma-delta modulator 81, it is possible to lock to the rate of any external signal on line 86, within the working range of the linked sigma-delta modulator, and to generate a second clock signal at a different sampling rate, for instance. Thus, the linked sigma-delta modulator may be used in any circuit which requires locking to a first clock signal and generating a second clock signal which is not necessarily an integer multiple of the first clock signal.

One application of the linked sigma-delta modulator 81 is PAL video locking. For PAL video locking it is necessary to lock to an input signal, on line 86, at a data rate of 15.625 kHz and to generate a sampling rate signal, on line 84, at a second frequency, for instance 44.1 kHz. This can be accomplished by selecting a scaling ratio M/N of 2.8224. Thus, with the linked modulator, the output signal, on line 84, from the linked sigma-delta modulator maybe at a higher rate, the same rate, or a lower rate than the input signal on line 86. In addition, the output signal need not be an integer multiple of the input signal. Thus, an advantage of the linked sigma-delta modulator is that the output clock signal is not limited to an integer divisor of an input clock signal. In addition, the output clock signal is locked to the input clock signal.

Figure 7A:
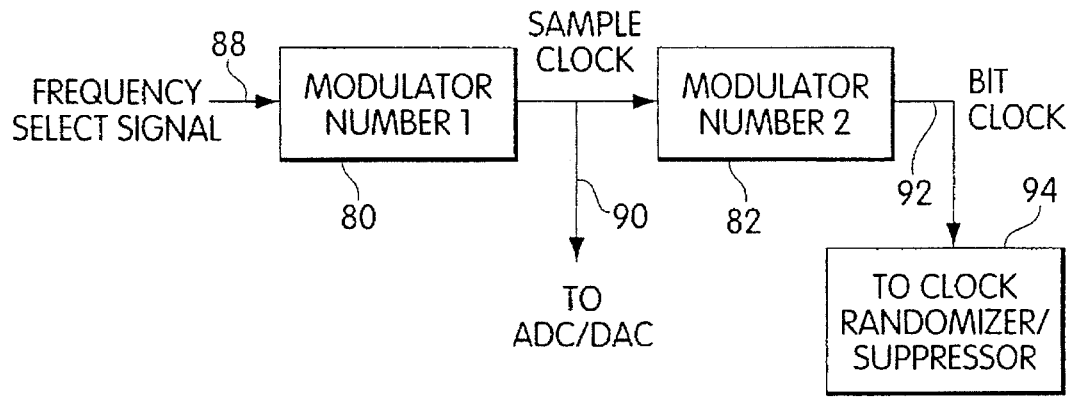
FIGS. 7a–7c illustrate different applications in which the linked sigma-delta modulator of FIG. 6 can be used.
Figure 7B:
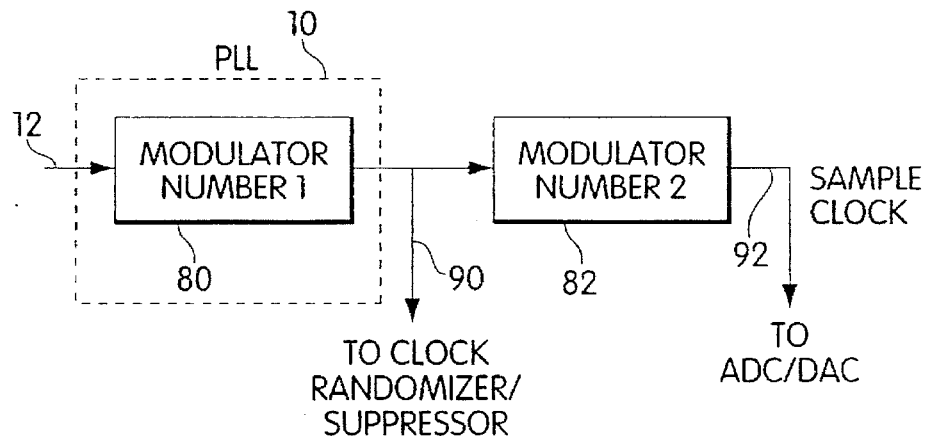
Figure 7C:
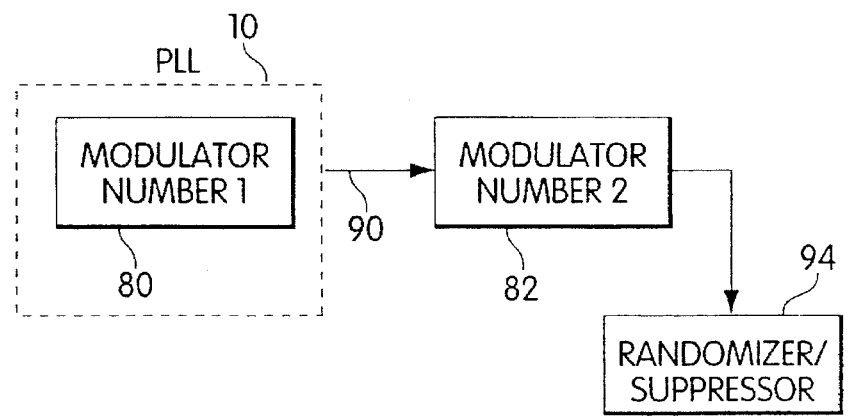

FIGS. 7a–7c illustrate three illustrative applications for which the linked sigma-delta modulator 81 may be utilized in FIG. 7a, a multi-bit digital signal, on line 88, representative of a desired data rate of an analog-to-digital, a digital-to-analog, or a digital-to-digital converter, as described above with reference to FIG. 3, is input to the first sigma-delta modulator 80. In a preferred embodiment of the invention, the digital signal, on line 88, is a 20-bit number representative of the desired data rate. This digital signal is sigma-delta modulated by the first sigma-delta modulator 80 which outputs a multi-bit code, on line 90, which can be fed, for example, to an interpolator of the analog-to-digital converter to increase the sample rate of the digital data stream in the analog-to-digital converter. In addition, the n-bit code is also fed to the second sigma-delta modulator 82, which scales the code by the M/N scaling ratio and outputs an n-bit code, on line 92, at a desired bit clock rate. This n-bit signal may be fed, for example, to a randomizer/ suppression circuit 94, such as described above in FIG. 3, to produce a bit clock signal without any unwanted tones.

FIG. 7b illustrates a second application of the linked sigma-delta modulator 81 which is used for NTSC video locking. In FIG. 7b, the first sigma-delta modulator 80 corresponds to the sigma-delta modulator disposed inside the phase-locked loop 100 of FIG. 3. In particular, the first sigma-delta modulator 80 is the 1/N and scaling sigma-delta modulator 49, of FIG. 5, having a first stage as illustrated in either one of FIGS. 4b and 4c. For the NTSC video locking application of FIG. 7b, an external synchronization signal on line 12, for example at a data rate of 15 kHz, is fed to the phase-locked loop 100, and the output signal, on line 90, corresponds to the 4-bit code, on line 54 of the phase-locked loop 100, output by the 1/N and scaling the sigma-delta modulator 49. This 4-bit code is fed to the suppressor circuit 56, within the phase-locked loop 100, as discussed above. This 4-bit code is also input to the second sigma-delta modulator 82 which scales the 4-bit code by the scaling ratio M/N to produce 4-bit codes, on line 92, representing a desired audio sampling rate of an analog-to-digital or digital-to-analog converter. An example may serve to illustrate this embodiment.

Assuming a synchronization signal, on line 12, of 15.625 kHz is input to the phase-locked loop 100, a 4-bit code, on line 90, of 1.953125 is output by the first sigma-delta modulator 80. This 4-bit code corresponds to the synchronization rate of 15.625 kHz. This 4-bit code is input to the second sigma-delta modulator 82 and scaled by a factor of M=13440/N=4375 to produce an allowance factor of 6.0 (an output 4-bit code 92 of +2). As discussed above with reference to Table 1, an output code of +2 corresponds to a sampling rate of 48 kHz. This 4-bit code is then fed, for example, to the interpolator 18 of the analog-to-digital converter to increase the data rate, as disclosed in the patent application Ser. No. 08/124,104, discussed above.

FIG. 7c illustrates a third application of the linked sigma-delta modulator 81. The first modulator 80 is the 1/N and scaling sigma-delta modulator 49 of FIG. 5, which is disposed within the phase-locked loop 100 of FIG. 3. Thus, operation of the first modulator is similar to that of the application shown in FIG. 7b. However, the 4-bit code 90 is utilized only by the second modulator 82 to produce an M/N scaled 4-bit code, on line 92. The M/N scaled 4-bit code is Then fed to a randomizer/suppressor circuit 94 to generate a bit clock without any undesired tones similar to that of the second modulator of the embodiment of FIG. 7a. Thus, this embodiment is utilized to generate a bit clock signal which is locked to the input signal and is a ratio multiple of the input clock signal.

Figure 8:
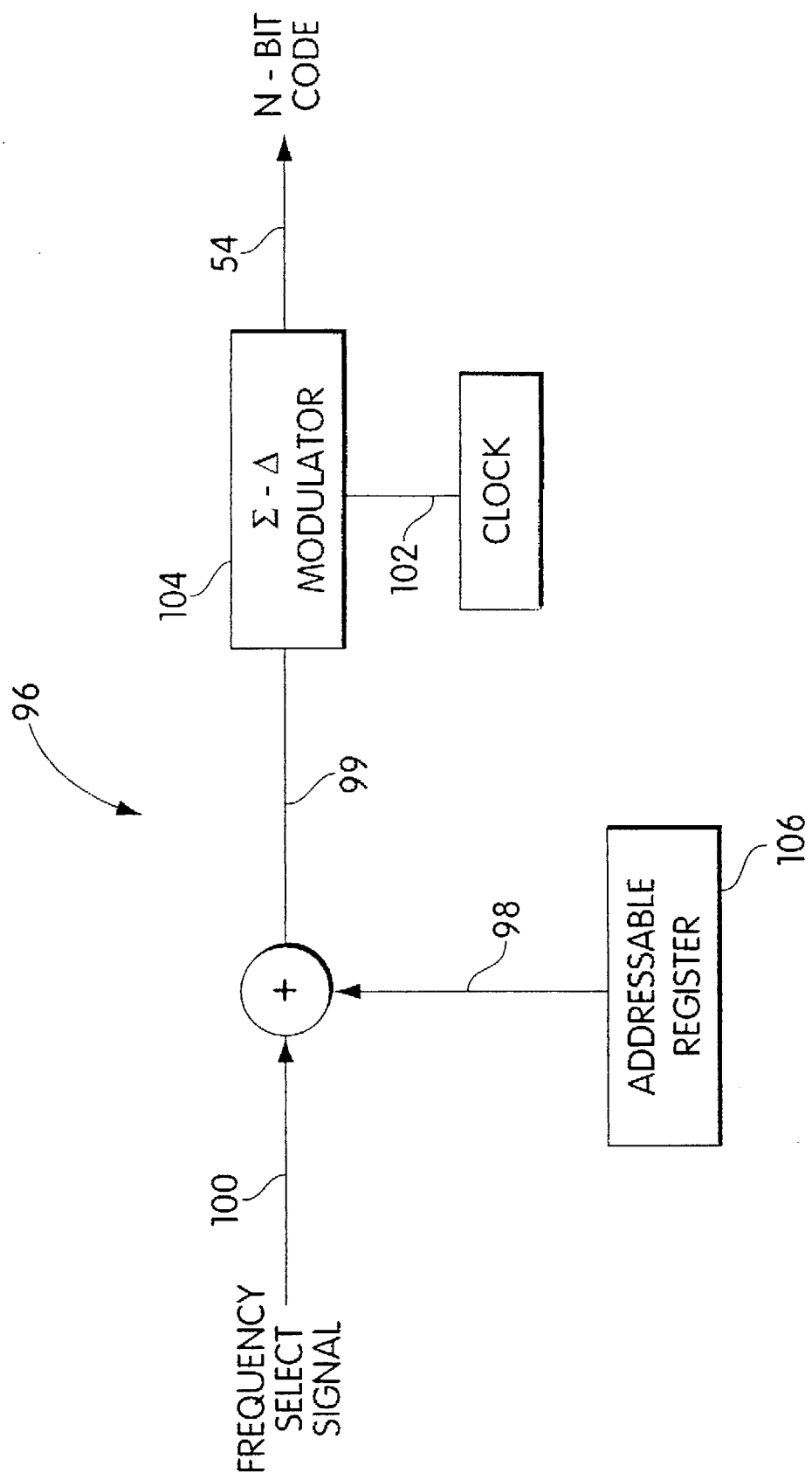
FIG. 8 is a block diagram of a sigma-delta modulator which can be adjusted to advance or retard a phase of a sigma-delta modulated clock signal under control of the sigma-delta modulator.

FIG. 8 illustrates an embodiment 96 of a sigma-delta modulator which can be used to change a magnitude of an n-bit code, on line 54, output by the sigma-delta modulator. Such a sigma-delta modulator may be used, for example when no external clock signal is available to phase lock to, to advance or retard a phase of a signal, under control of the sigma-delta modulator 96. The phase of the signal can be advanced or retarded, for example, by one of interpolating a signal under control of the n-bit code, decimating a signal under control of the n-bit code and manufacturing a signal with a suppressor circuit under the control of the n-bit code. Thus, the user phase adjustment sigma-delta modulator 96 may be used with any of the analog-to-digital, the digital-to-analog and the digital-to-digital converters discussed in the patent application referenced above.

The user-phase adjustment sigma-delta modulator 96 is utilized, for example, in V.32 modems where an analog-to-digital converter, of a receiving modem, is to sample a received signal at a same frequency and a same phase as the signal transmitted by the transmitting modem's digital-to-analog converter. The receiving modem must somehow force the received signal to be sampled in phase with the transmitted signal.

Figure 9:
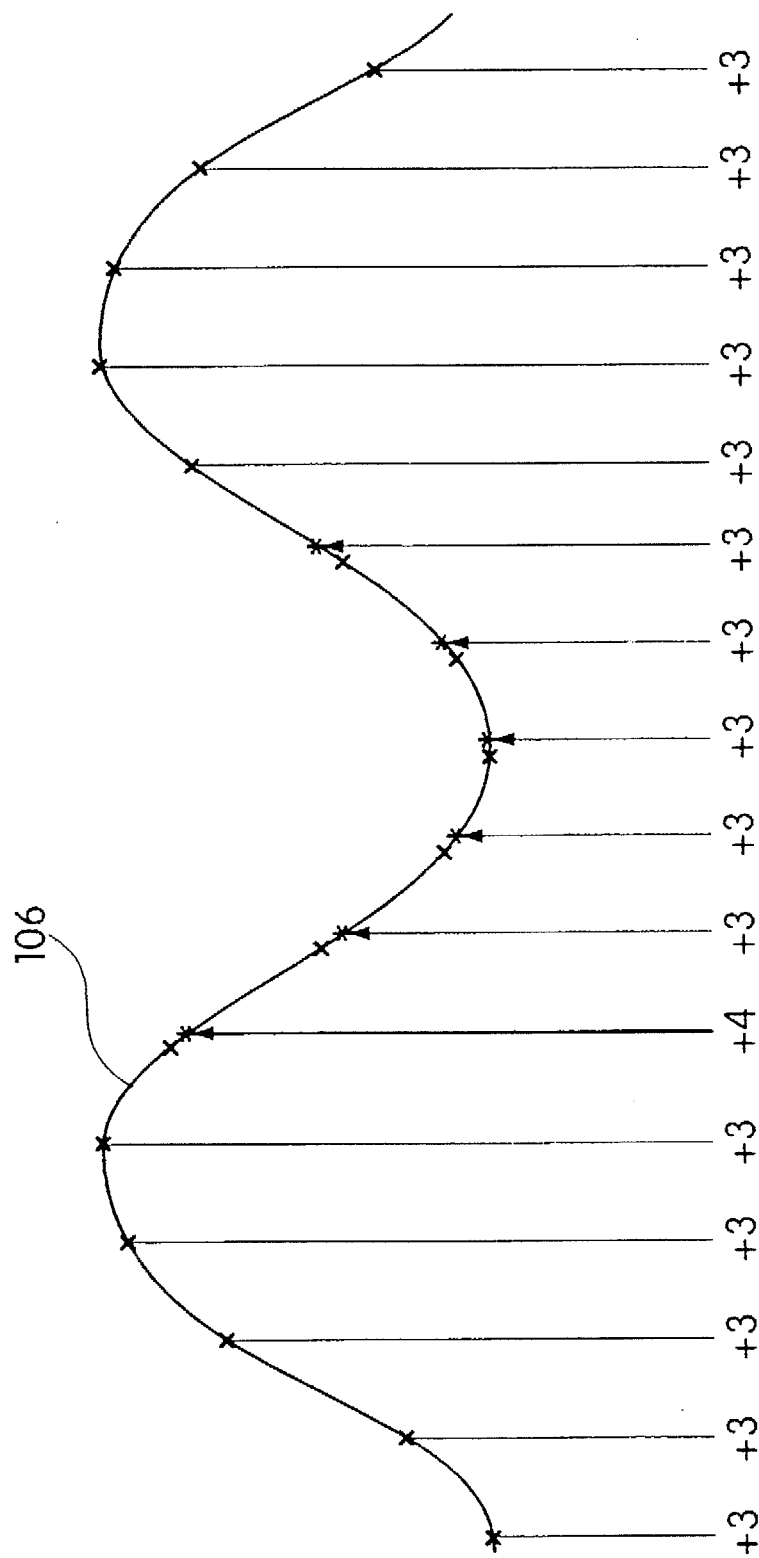
FIG. 9 is an illustration of a change in a magnitude and a phase of a clock signal under control of the sigma-delta modulator of FIG. 8.

In the embodiment of FIG. 8, an n-bit phase shift signal, on line 98, is added to the frequency select signal, on line 100, to change a magnitude of a clock signal, on line 102, fed to the sigma-delta modulator 104. In order to understand how a phase of a signal may be adjusted with this embodiment 96 of the sigma-delta modulator, one must understand that as an impulse is fed to a sigma-delta modulator 104, an output code 54, on average, changes to reflect the impulse and then to restore the output code 54 to the average input signal. Thus, once the impulse has been completely represented, the sigma-delta modulator 104 will then, on average, represent the input signal 100. If the n-bit code 54 is then used to any one of decimate, interpolate, or manufacture a clock signal, the magnitude and thus the phase of such signal can be changed as will now be described. Referring to FIG. 9, there is illustrated a signal 106 which is created by any one of an interpolator, a decimator, or a suppressor circuit under the control of the sigma-delta modulator 96. FIG. 9 also illustrates the n-bit code, on line 54 output by the sigma-delta modulator 96, and the corresponding magnitude and phase of the signal 106 in relation to the n-bit code 54. More specifically, one can see that a corresponding magnitude and phase of the signal 106, represented by the locations marked with an X, corresponds to the +3 n-bit code. In addition, FIG. 9 illustrates that an n-bit code of +4, resulting from an impulse at the input to the sigma-delta modulator 104, results in a change in magnitude and phase of the signal 106 as represented by the locations marked with a *. Thus, depending upon the value and the sign of the n-bit code, on line 54, a magnitude and a phase of the signal 106 can either be advanced or retarded. Thus, as discussed above with respect to V.32 modems, a receiving modem may align a received signal to that of a transmitted signal by creating impulses at the input, on line 99, to the sigma-delta modulator 104 of the sigma-delta modulated embodiment 96.

In a preferred embodiment of the sigma-delta modulator 96, impulses 98 are added to the frequency signal 100, by the use of a user addressable register 106. A first bit of the n-bit phase shift signal, on line 98, controls a direction of the phase shift (i.e. either advance or retard the phase). In addition, the addressable register is an eight-bit addressable register in which, each least-significant bit, of the addressable register, represents 0.12 degrees of phase shift. The 0.12 degrees of resolution results from 384 master clock pulses per 360° of the signal 106, eight bits of resolution in the addressable register 106 and the scaling factor of 1,024 in the 1/N and scaling sigma-delta modulator 49, of FIG. 3 (resolution=360°/384×8)×1,024). It is to be appreciated that either lower or higher resolution can be achieved by choosing a different scaling factor and/or a larger or smaller bit addressable register.

The phase-adjustment sigma-delta modulator 96, can be used for example in the analog-to-digital converter of U.S. application Ser. No. 08/124,104 to control, the interpolator 18 of FIG. 2. The sigma-delta modulator 20, of FIG. 2, will then output a multi-bit code, on line 23, representative of a desired sample rate of digital data, on line 32. This multi-bit number is used by the interpolator 18 to increase the sample rate of the digital data stream, on line 17, by an interpolation factor. Thus, the phase-adjustment sigma-delta modulator 96, of the present invention, can be used to add an impulse to the frequency select signal 24 so as to either advance or retard a magnitude and a phase of the data stream, on line 19.

The phase-adjustment sigma-delta modulator 96, can also be used, for example, in the digital-to-analog converter of U.S. application Ser. No. 08/120,957. For example, the phase-adjustment sigma-delta modulator 96 can be used, in FIG. 2, to control the decimator 21 which decimates the digital data stream, on line 19, under control of the phase-adjustment sigma-delta modulator 96 of the present invention. Thus, the phase-adjustment sigma-delta modulator can be used to add an impulse to the sampling frequency select signal, on line 24, to produce the n-bit code, on line 26, output by the phase-adjustment sigma-delta modulator. The n-bit code, on line 26, is then used to alter the decimator 21 to produce a change in a magnitude and a phase of the data stream, on line 14, at the output of the decimator 21.

Further, the phase-adjustment sigma-delta modulator 96, can be used with the digital-to-digital converter of U.S. application Ser. No. 08/241,059. For example, the phase-adjustment sigma-delta modulator 69 can be used with the digital-to-digital converter of FIG. 2 to replace either one of the sigma-delta modulators 20 controlling the decimator 21 and the sigma-delta modulator 32 controlling the interpolator 30. Therefore, the phase-adjustment sigma-delta modulator 96, of the present invention can be used to create an impulse at the frequency select signal, on line 24 to the input of sigma-delta modulator 20 or an impulse to the frequency select signal, on line 44, to the input of the sigma-delta modulator 32. In addition, the n-bit signal, on line 26 output by the sigma-delta modulator 20 or the n-bit signal, on line 46, output by the sigma-delta modulator 32 will then be used to an advance or a retard a phase of the data signal, on line 14, at the output of the decimator 21 or to advance or retard a phase and a magnitude of the data signal, on line 34 at the output of the interpolator 30.

Having thus described one (several) particular embodiment(s) of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A circuit which can be phase and frequency locked to a phase and frequency of an input signal, comprising:

a counter, responsive to the input signal and a master clock signal, for determining a period of the input signal and for outputting a period signal representative of the period; and a phase-locked loop, responsive to the period signal and to the input signal, for locking to a phase and a frequency of the input signal and for providing a phase difference signal representative of a phase difference between the period signal and the input signal.

2. A circuit which can be phase and frequency locked to a phase and frequency of an input signal, comprising:

a counter, responsive to the input signal and a master clock signal, for determining a period of the input signal and for outputting a period signal representative of the period;

a phase-locked loop, responsive to the period signal and to the input signal, for locking to a phase and a frequency of the input signal and for providing a phase difference signal representative of a phase difference between the period signal and the input signal; and wherein the phase-locked loop includes a sigma-delta modulator, responsive to a sum of the period signal and the phase difference signal, for providing a sigma-delta modulated control signal which is locked to the phase and the frequency of the input signal.

3. The circuit of claim 2, wherein the phase-locked loop further comprises a programmable filter having a gain which is programmable so that a sensitivity of the phase-locked loop can be adjusted.

4. The circuit of claim 2, wherein the phase-locked loop further comprises a digital oscillator responsive to the sigma-delta modulated control signal, which generates a first clock signal; and a divider, which divides the first clock signal to a second clock signal at a frequency of the input signal.

5. The circuit of claim 4, wherein the phase-locked loop includes a phase- and frequency-detector, responsive to the input signal and the second clock signal, which determines a frequency difference and a phase difference, and which outputs the phase difference signal.

6. The circuit of claim 2, wherein the phase-locked loop further includes means, responsive to the sum of the phase difference signal and the period signal, for determining an inverse of the summed signal without any truncation errors resulting from the inversion.

7. The circuit of claim 2, wherein the phase-locked loop further includes a suppressor, responsive to the master clock signal and the sigma-delta modulated control signal, for suppressing a number of pulses of the master clock signal as a function of the sigma-delta modulated control signal and for outputting a first clock signal.

8. The circuit of claim 6, wherein the means for inverting further comprises means for scaling the inverted signal and for outputting the sigma-delta modulated control signal.

9. The circuit of claim 7, wherein the suppressor further includes a randomizer which ensures that each pulse of the master clock signal is equally suppressed on average.

10. The circuit of claim 6, wherein the inverting means further comprises means for providing an initial guess of the inverted signal without distorting a noise shape of the sigma-delta modulated control signal.

11. A phase-locked loop, analog-to-digital converter, comprising:

a counter, responsive to an input signal and a master clock signal, for determining a period of the input signal and for outputting a signal representative of the period;

a phase-locked loop, responsive to the period signal and to the input signal, for locking to a phase and a frequency of the input signal and for providing a phase difference signal representative of a phase difference between the period signal and the input signal;

a sigma-delta modulator, responsive to a sum of the period signal and the phase difference signal, for providing a sigma-delta modulated control signal which is locked to the phase and the frequency of The input signal; and an analog-to-digital converter, responsive to the sigma-delta modulated control signal, which converts an analog signal to a digital signal at a first data rate, which increases the data rate of the digital signal to an increased data rate in response to the sigma-delta modulated control signal and which decimates the increased data rate digital signal to a second data rate.

12. A phase-locked, digital-to-analog converter, comprising:

a counter, responsive to an input signal and a master clock signal, for determining a period of the input signal and for outputting a signal representative of the period;

a phase-locked loop, responsive to the period signal and to the input signal, for locking to a phase and a frequency of the input signal and for providing a phase difference signal representative of a phase difference between the period signal and the input signal;

a sigma-delta modulator, responsive to a sum of the period signal and the phase difference signal, for providing a sigma-delta modulated control signal which is locked to the phase and the frequency of the input signal; and a digital-to-analog converter, responsive to the sigma-delta modulated control signal, which receives digital signals at a first data rate and increases the digital signals to a second data rate, which decimates the digital signals at the second data rate in response to the sigma-delta modulated control signal to provide digital signals at a third data rate and which converts the digital signals at the third data rate to analog signals.

13. A phase-locked, digital-to-digital converter comprising:

a counter, responsive to an input signal and a master clock signal, for determining a period of the input signal and for outputting a signal representative of the period;

a phase-locked loop, responsive to the period signal and to the input signal, for locking to a phase and a frequency of the input signal and for providing a phase difference signal representative of a phase difference between the period signal and the input signal;

a sigma-delta modulator, responsive to a sum of the period signal and the phase difference signal, for providing sigma-delta modulated control signal which is locked to the phase and the frequency of the input signal; and a first interpolation and decimation means for receiving a digital signal at a first data rate, for increasing the digital signal to a second data rate and for decimating the digital signal to a third data rate in response to the sigma-delta modulated control signal.

14. The digital-to-digital converter of claim 13, further comprising a second interpolation and decimation means for receiving the digital signal at the third data rate, for increasing the digital signal at the third data rate to a fourth data rate in response to a second sigma-delta modulated control signal and for decimating the digital signal at the fourth data rate to provide a digital signal at a fifth data rate.

15. The digital-to-digital converter of claim 14, further comprising a second phase-locked loop circuit including:

a second counter responsive to a second input signal and the master clock signal, for determining a period of the second input signal and for outputting a second period signal representative of the period;

a second phase-locked loop, responsive to the second period signal and to the second input signal, for locking to a phase and a frequency of the second input signal and for providing a second phase difference signal representative of a phase difference between the second period signal and the second input signal; and a second sigma-delta modulator, responsive to a sum of the second period signal and the second phase difference signal, for providing the second sigma-delta modulated control signal which is locked to the phase and the frequency of the second input signal.

* * * * *